US007325219B2

(12) United States Patent
Jacobsen et al.

(10) Patent No.: US 7,325,219 B2
(45) Date of Patent: Jan. 29, 2008

(54) METHOD AND APPARATUS FOR DETERMINING PROBING LOCATIONS FOR A PRINTED CIRCUIT BOARD

(75) Inventors: Chris R. Jacobsen, Ft. Collins, CO (US); Kenneth P. Parker, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 194 days.

(21) Appl. No.: 11/058,811

(22) Filed: Feb. 16, 2005

(65) Prior Publication Data

US 2006/0192579 A1    Aug. 31, 2006

(51) Int. Cl.
*G06F 17/50* (2006.01)
(52) U.S. Cl. ...................................... 716/15
(58) Field of Classification Search ............. 716/8–9, 716/15, 2, 4
See application file for complete search history.

(56) References Cited

U.S. PATENT DOCUMENTS

| 6,839,883 | B2 | 1/2005 | Ahrikencheikh | |
| 6,839,885 | B2 * | 1/2005 | Ahrikencheikh | 716/9 |
| 7,103,856 | B2 * | 9/2006 | Ahrikencheikh | 716/1 |
| 2004/0031000 | A1 * | 2/2004 | Ahrikencheikh | 716/4 |
| 2006/0129955 | A1 * | 6/2006 | Jacobsen et al. | 716/4 |

* cited by examiner

*Primary Examiner*—Stacy Whitmore

(57) ABSTRACT

Techniques for automating probing location selection during printed circuit board (PCB) and corresponding PCB tester fixture design are presented. The invention includes a system and algorithm for selecting a probe layout comprising a set of probing locations for a printed circuit board design having a plurality of nets, at least some of which have a number of alternative possible probing locations. The system and algorithm iteratively generates a potential probe layout comprising one or more probing locations per net, and based on the potential probe layout, determines one or more regions of maximum deflection. A probing location from the potential probe layout that is located in a region of maximum deflection and is associated with a net having one or more alternative probing locations is removed from the potential probe layout and replaced in the with one of the one or more alternate probing locations associated with the net. Regions of maximum deflection are recalculated based on the modified potential probe layout, and the replacement process is repeated until respective magnitudes of the respective areas of maximum deflection are below a threshold value.

22 Claims, 5 Drawing Sheets

METHOD AND APPARATUS FOR DETERMINING PROBING LOCATIONS FOR A PRINTED CIRCUIT BOARD

BACKGROUND OF THE INVENTION

The present invention relates generally to printed circuit board design and testing, and more particularly to techniques for determining probing locations on a printed circuit board for tester access.

Electronic products typically contain at least one printed circuit board (PCB). A PCB generally includes a number of electronic components that are electrically connected together by electrical paths called "nets" that are formed of various combinations of conductive traces, vias, wires, and solder, to form an operational circuit that performs a given function. A conventional PCB development cycle includes PCB design, test development, and tester fixture development.

Where possible, given the state of the art of available development tools in the market, many steps involved in PCB design, test development and fixture development are automated, either fully or at least partially. For example, large automated industrial CAD development systems have been developed that allow floorplanning, schematic capture, trace routing, design verification, and even test generation. These automated features have significantly improved the time-to-market of an integrated circuit assembly. However, several steps in the PCB development cycle are still performed mainly by manual intervention and iterative effort. For example, as illustrated in FIG. 1, the addition of test pads to the circuit during the PCB design stage and the manual addition of board pushers for push-down top gate fixtures during the fixture development stage have to this point been difficult to automate. The reasons for this are multifold, a better understanding of which will become clearer through a more detailed description of the PCB development process.

During the PCB design stage, a CAD system is typically used to design and lay out the PCB, including schematic capture and component and trace layout of the PCB under development. Prior to completion of the final PCB design, test pads are added to the design to provide tester probing access for all nets used in board testing (such as in-circuit test (ICT)).

Once the design has been captured, routed, and test pads are added, the CAD data files representing the PCB design with test pads inserted are then released for test development. In-Circuit Test (ICT) is a well-known test methodology that includes testing hardware that can probe nets of the PCB through a combination of tester relays, tester interface pins, and custom fixturing. More particularly, FIG. 1 illustrates a portion of a conventional ICT tester environment 200. The tester environment 200 includes an automated tester 210 that implements the test electronics 212, including measurement circuits, relays, control electronics, etc. The tester 210 provides a field of tester interface pins 214, which are arranged in a fixed configuration and may be connected to various measurement circuits within the test electronics 212 by way of electronically controlled relays (not shown). Because the tester interface pin field is a fixed configuration, in order to probe test pads 204 on a PCB under test 202, the PCB 202 is generally mounted in a customized fixture 220 which operates as an adapter between fixed configuration tester interface pins 214 and various test pads 204 on the PCB 202.

The tester fixture 220 includes a probe protection plate 240, standard spring probes 232 whose tips exactly correspond to test pads 204 on the bottom of the PCB under test 202, a top push-down gate 250 which opens and closes by way of a hinge 252, spacers called board pushers 258 mounted in the bottom of the push down gate 250 which limit the deflection of the PCB 202 under vacuum loading, a probe mounting plate 230 in which the spring probes 232 are installed, personality pins 226 which are wired to the spring probes 232, and an alignment plate 222 which aligns the wirewrap tails of the personality pins 226 into a regularly spaced pattern so that they line up with tester interface pins 214 mounted in the tester 210. As known in the art, a spring probe is a standard device, commonly used by the test community, which conducts electrical signals and contains a compression spring and plunger that move relative to the barrel and/or socket when actuated. A solid probe also conducts electrical signals but has no additional parts which move relative to each other during actuation.

During test, the PCB under test 202 is pulled down by vacuum or other known mechanical means so that the test pads 204 on the bottom of the PCB under test 202 contact the tips of the spring probes 232. The sockets of the standard spring probes 232 are wired to personality pins 226, and the alignment plate 222 funnels the long, flexible personality pin tips into a regularly spaced pattern. The tips of personality pins 226 contact the tester interface pins 214 mounted in the tester 210. Once electrical contact between the PCB under test 202 and the tester 210 is established, in-circuit or functional testing may commence.

During the test development stage the CAD data is translated as necessary into native formats of the test platform (i.e., formatted into a format expected by the ICT tester), from which tests are developed. Most of today's PCB testers come with software packages that can automatically generate tests when full access is available. Some testers, for example, the Agilent 3070 In-Circuit Test (ICT) Board Test System, manufactured by Agilent Technologies, Inc. having headquarters in Palo Alto, Calif., also include fixture generation software that automatically generates fixture design files needed to build an ICT fixture. Fixture design files typically include specifications for the board outline coordinates, tooling pin holes and locations, drill information, probe and socket insertion information, and wiring information. The design of a fixture requirements consideration of certain criteria such as maximum force per square unit applied to the board, maximum board flex thresholds, etc. To meet these criteria, the fixture builder must consider the layout of the probes 232. An average fixture may include 3000 to 4000 probes 232, each exerting, for example, 8 ounces of force against the bottom of the PCB 202 during test. This works out to nearly a ton of force pushing upward against the PCB 202. If the counteracting forces of the probes and board pushers are unevenly distributed across the entire board, the PCB will flex and may cause faulty or even damaging results. Accordingly, most ICT fixtures include a top push-down gate 250 with push-down spacers, herein called board pushers 258, to counteract the fixture probe forces as shown in FIG. 2. However, even in a fixture that implements a top push-down gate 250, if the counteracting forces of the probes and board pushers are not evenly distributed across the entire board, the PCB will flex and may cause stresses that can damage solder connections or even the components themselves. Accordingly, the fixture designer must balance the board by strategically positioning the board pushers in the fixture to counteract the forces of the fixture probes so as to eliminate or significantly reduce board flex. However, there is no existing automated technique for determining locations of board pushers in a fixture. Instead, the gate and board pusher layout is usually designed manually after importing the fixture files resulting from the PCB design into a CAD tool (typically AutoCAD). Board pusher layout can be time-consuming, and since done manually, may not truly minimize board flex.

In addition to the limitation of manual addition of test pads to the PCB design, today's techniques for adding test pads or probing locations to the PCB design are also limited in that they treat the problems of determining probing locations and minimizing board flex as independent problems, first determining probing locations on the board and then, based on the determined probing locations, determining locations of board pushers for counteracting the forces of the probes on the board in places of maximum deflection. However, a person skilled in the art will recognize that the placement of fixture probes and the placement of board pushers are highly correlated problems. That is, since both the probes and the board pushers directly contribute to the force components applied to the board but are in principle placed by design to counteract the forces of one another as much as possible, the locations of the board pushers are highly correlated with the positions of the probing locations. Accordingly, it would be desirable to have a technique that operates to globally minimize board flex (and as a side benefit, the number of board pushers required in a fixture) by iteratively, automatically, and intelligently determining probing locations in a PCB design with a view towards meeting the requirements of the associated fixture design, in particular the requirement for minimizing board flex.

The addition of conventional test pads to the design is typically a manual process. Conventional test pads are implemented as extensions of traces on the exposed trace layers in that they lie in the same plane as one of the exposed trace layers and are formed integrally with traces on the exposed trace layer using the same trace material. Conventional test pads are typically round, square, or some other planar geometric shape and have a surface area large enough to accommodate a probe head so that when the PCB is probed at the test pad, the probe does not contact other traces or components on the PCB. Furthermore, the size of a test pad is also determined by pointing errors in probe placement that may cause lateral offsets. Thus, a test pad may be somewhat larger than the probe head itself, to assure a good probability of hitting it. Because conventional test pads occupy area on the trace layer, the addition of test pads to the PCB design often require rerouting of nets of the PCB design. The addition of test pads to the design using conventional techniques also carries risks in adversely affecting surrounding circuitry or changing the transmission line characteristics of the traces over which high-speed signals are communicated. Accordingly, whenever a test pad is added to the PCB design using conventional techniques, the effects of the design change must be either calculated or simulated in order to ensure that the location of the test pad and its associated changes to the design do not adversely affect circuit operation. The addition of test pads to the design using conventional techniques can therefore be iterative in nature in order to find an acceptable layout. All of the above amounts to a considerably time consuming process which is, in addition, expensive also in terms of board real estate. Accordingly, the addition of multiple possible alternative test pads for any significant number of nets of a PCB design using conventional techniques is rare, and the feasibility of minimizing board flex based on selection of probing locations is therefore low.

More recently, novel test access structures, referred to herein as "bead probes" are being used as test access structures in place of conventional test pads. Bead probes are implemented along the z-axis of a PCB board having metal and dielectric layers oriented in the x-y plane. Bead probes are described in U.S. patent application Ser. No. 10/670,649, to Parker et al., entitled "Printed Circuit Board Test Access Point Structures and Method for Making the Same", filed Sep. 24, 2003 and assigned to the assignee of interest herein, the entire disclosure of which is incorporated herein by reference for all that it teaches. Research has shown that bead probes may be fabricated along existing nets of the PCB design without impacting the PCB layout or high-speed electrical characteristics of the net, as reported in "A New Probing Technique for High-Speed/High Density Printed Circuit Boards", International Test Conference, October 2004, the entire document of which is incorporated herein by reference for all that it teaches. Since bead probes may be added to PCB designs without requiring net re-routing, in principle, as previously described, any net having at least a portion of the net implemented in an exposed layer of the PCB (i.e., is implemented on an outer PCB layer that is accessible for probing) can have a bead probe placed anywhere along the exposed portion of the net provided that the fixture probe probing the bead probe will not strike a nearby component on the board or interfere with a nearby fixture probe. The number of potential probing locations on a given net can therefore be quite high, allowing a high degree of flexibility in choosing the locations to probe. The bead probes can be implemented as solder beads conductively connected directly to a trace, or can be implemented integral to the trace as merely thicker areas along the trace. This new bead probe technology facilitates the ease at which test pads can be added to the PCB design, and further enables fast and efficient implementation of multiple bead probes (or possible alternative probing locations) along each net of any significant length.

Therefore, with the ease, flexibility, and availability now offered by the new bead probe technology of implementing multiple alternative probing locations per almost any given net in a PCB design, the consideration of manipulating the probing location layout with a view to meeting the requirements of the fixture design of the tester fixture associated with the PCB design is now more feasible.

SUMMARY OF THE INVENTION

The present invention is a technique for optimizing the layout of probing locations for a PCB with a view to minimizing board flex when mounted in a tester fixture customized to test the PCB. The invention applies plate problem principles used in techniques previously reserved for post-probing-location selection tasks such as determination of board pusher and board retainer locations for minimizing board flex, and applies the principles during the probing location selection phase. The final probe layout of the fixture is therefore "pre-optimized" in terms of minimizing board flex by the locations of the probes themselves, thereby reducing the calculation time for determining, and corresponding number of, board pusher and retainer locations after the probing location selection is completed.

According to a preferred embodiment of the invention, a probing location selection algorithm is executed on computer hardware to automatically determine the probing locations for a PCB based on a PCB design. The PCB design includes a plurality of nets, at least some of which are characterized as having a plurality of alternative probing locations. The probing location selection algorithm generates a potential probe layout by selecting one or more probing locations per net. (A typical probe layout will require at most one probing location per net.) Based on the potential probe layout, the probing location selection algorithm then determines one or more regions of maximum deflection, and preferably one or more regions of minimum deflection. The probing location selection algorithm then replaces a probing location in the potential probe layout that is located in a region of maximum deflection with an alternate probing location, preferably located in a region of minimum deflection, that provides access to the same net as the replaced probing location. Regions of maximum and minimum deflection are recalculated based on the updated potential probe layout, and substitution of a selected probing location with a valid alternative probing location is repeated until the difference between maximum deflection and minimum deflection no longer converges or reaches a predetermined threshold value, or no alternate probing locations are available.

The probing location selection algorithm may be used to select probing locations for PCBs to be mounted in tester fixtures that allow either single-side probing only or dual-side probing. If the tester and fixture accommodates probing on both the bottom side and the top side of the PCB, the probing location selection algorithm will preferably attempt to balance the distribution of probing locations to both sides of the PCB so that the forces applied by probes on both sides of the PCB preferably cancel each other out or result in minimum board flex. Dual-side probing affords the additional advantage that the probes themselves can be used to counteract forces from opposite side probes, thereby reducing the need for and number of board pushers.

Once the probing location selection algorithm has determined the optimal probe layout, the maximum board flex may still exceed safe limits. Accordingly, if so, board pushers and/or retainers may be added to the fixture design at preferably calculated optimum pusher locations (i.e., providing counteracting force at points of maximum deflection) to finally minimize board flex.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

For purposes of clarity, the following terms are defined:
"net"—a signal transmission line which passes signals between two or more endpoints over an electrically conductive path; may be implemented as one or more of any of, including combinations of, the following: a trace, a via, a wire, a component lead, a solder ball, a wire bond, or any other electrically conductive element electrically connected between the two or more endpoints and through which the signal passes;

"test pad"—a point on a net accessible for probing, typically characterized by a surface area large enough to accommodate a probe head;

"probing location"—a test pad that is or is selected to be probed;

"fixture probe"—an electrically conductive element of a tester fixture which operates as a passive transmission line at least between a first end and a second end of the electrically conductive element, the first end configured to electrically contact a test pad of a circuit and the second end configured to electrically contact another electrical component of interest, such as a tester interface pin, a test pad of a wireless fixture PCB, a node of a tester measurement circuit, etc.).

Figure 2:
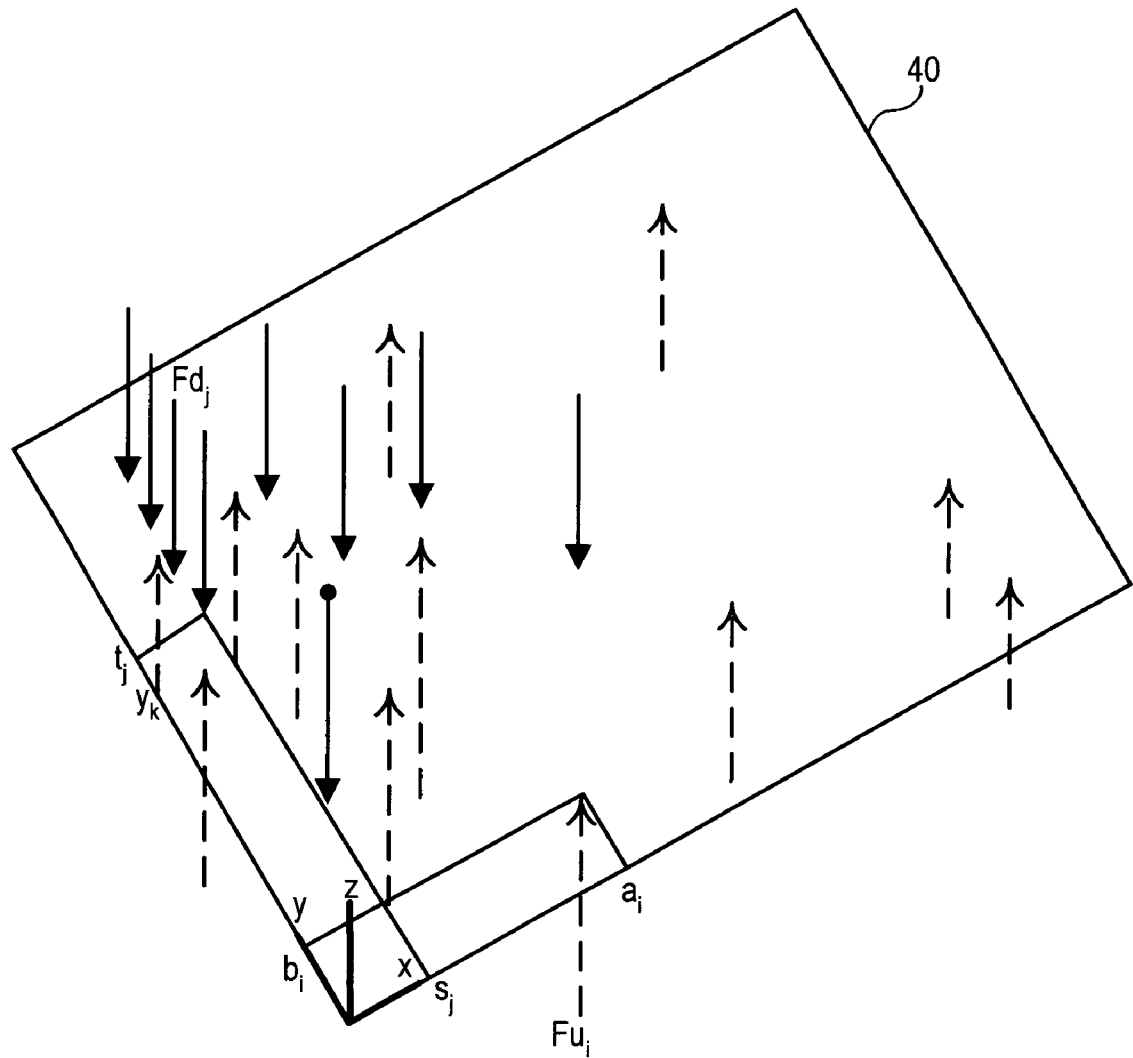
FIG. 2 is a perspective view of a printed circuit board illustrating the probing forces applied to a printed circuit board during test.

Turning now to the invention, FIG. 2 illustrates the different types of forces and supports that a PCB 40 is typically subjected to during test. A coordinate system (x, y, z) is located at a corner of the PCB 40 for convenience of description. As shown, the PCB 40 is subject to several forces.

Figure 1:
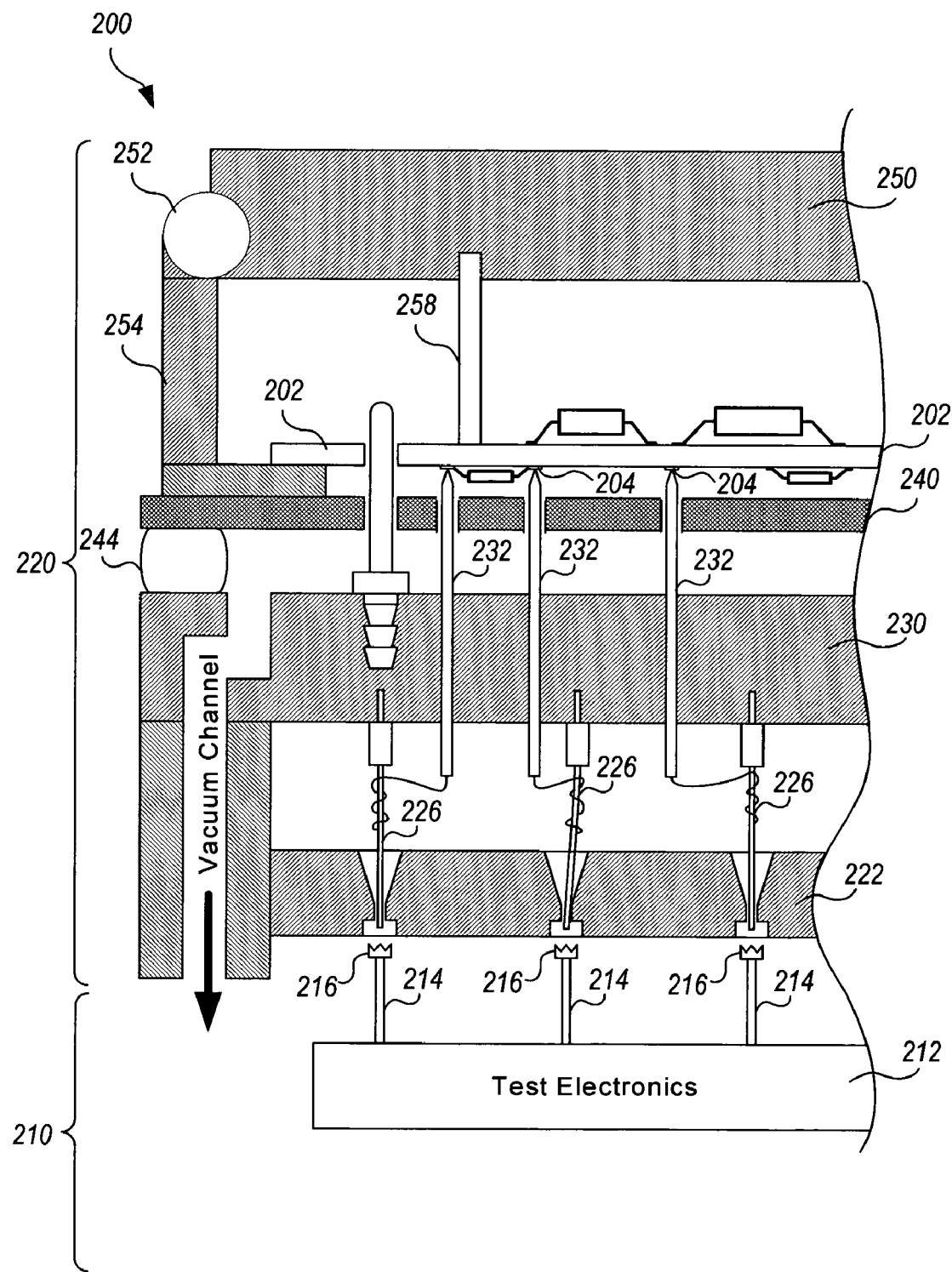
FIG. 1 is a side cut-away view of a portion of a tester with a test fixture and PCB under test mounted thereon.

Force $Fd_j$ is force from the fixture probes acting downward on the PCB at known locations with coordinates ($s_j$, $t_j$, h) in the (x, y, z) coordinate system. In the context of the present invention, the locations and number p of such $Fd_j$ forces may change each time the potential probe layout is modified by the probing location selection algorithm. Force $Fu_j$ is force from the fixture probes acting upward on the PCB at known locations with coordinates ($a_i$, $b_i$, h) in the (x, y, z) coordinate system. In the context of the present invention, the locations and number m of such $Fu_i$ forces may change each time the potential probe layout is modified by the probing location selection algorithm. In a single-sided probing fixture, all probes will exert force in the same direction (e.g., all upward forces $Fu_i$ or all downward forces $Fd_j$). For example, the fixture shown in FIG. 1 is a single-sided probing fixture that probes the PCB under test from below with probes applying upward forces $Fu_i$ on the PCB under test. In a dual-sided probing fixture, there will likely be some probes that exert upward forces $Fu_i$ and some probes that exert downward forces $Fd_j$. As illustrated, the forces $Fd_j$ and $Fu_i$ are generally all directed in the direction perpendicular to the plane of the PCB under test (i.e., in the z-direction). Accordingly, it is safe to theoretically consider that all forces have negligible or null components in the x- and y-directions.

Figure 3:
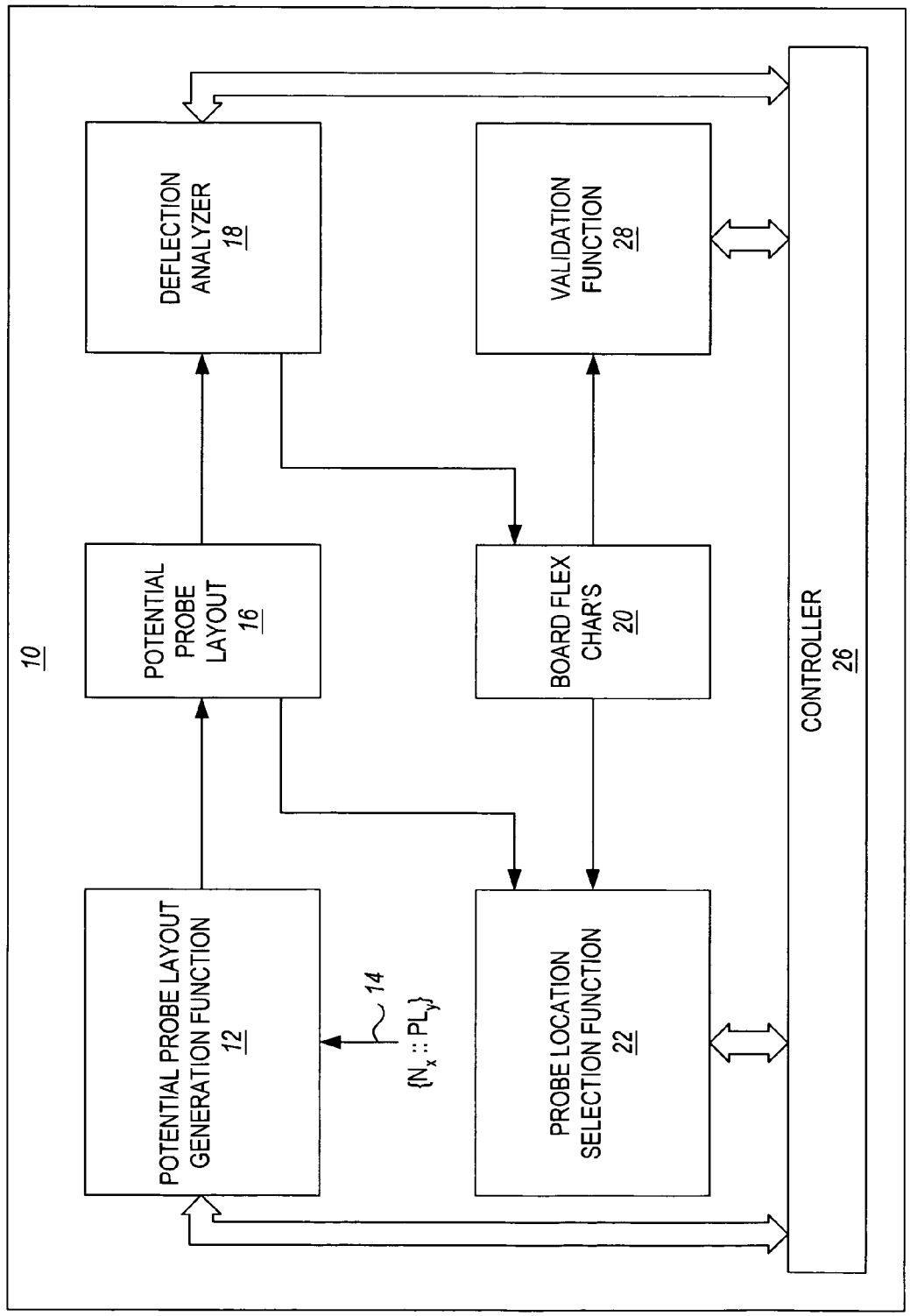
FIG. 3 is a block diagram illustrating a system that implements a preferred embodiment of the invention.

FIG. 3 is a functional block diagram illustrating a probing location selection system 10 that implements a preferred embodiment of the invention. As shown, the probing location selection system 10 comprises a potential probe layout generation function 12 which receives a set 14 of nets and associated possible probing locations for a printed circuit board design. The set 14 may be a simple relational list, or may be embedded in a file such as a PCB design file and hence require extraction. At least some of the plurality of nets have associated with them a plurality of alternative possible probing locations. The potential probe layout generation function 12 extracts the set 14 of nets and associated possible probing locations, if necessary, and generates a potential probe layout comprising at most one probing location per net. The potential probe layout generation function 12 may choose probing locations, randomly, pseudorandomly, or may perform calculations to provide an initial attempt to reduce board flex.

The probing location selection system 10 also includes a printed circuit board deflection analyzer 18 that determines board flex characteristics 20 based on the potential probe layout 16. In the preferred embodiment, the board flex characteristics comprise one or more points or regions on the board of maximum deflection and/or one or more points or regions on the board of minimum deflection.

The probing location selection system 10 also includes a probing location selection function 22. Based on the board flex characteristics 20 and potential probe layout 16, the probing location selection function selects a probing location from the potential probe layout that is located in a region of maximum deflection and that is associated with a net having one or more alternative probing locations, and modifies the potential probe layout 16 by replacing the selected probing location with one of the one or more alternate probing locations associated with the net. Preferably, the alternate probing location chosen to replace the selected probing location is located in a region of minimum or relatively lower deflection on the board.

A controller 26 triggers the deflection analyzer 18 to recalculate the board flex characteristics 20 based on the modifications to the potential probe layout 16. A validation function 28 analyzes the board flex characteristic 20 to determine whether the potential probe layout meets a set of predefined board flex criteria. The predefined board flex criteria may be a maximum deflection threshold value, a relative maximum difference between maximum and minimum deflections, etc. The validation function 28 thus likely comprises a comparison function or other function necessary to achieve the corresponding analysis.

The controller 26 effects iteration of the functions of the deflection analyzer 18, the probing location selection function 22 and validation function 28 until the predefined board flex criteria is met, if possible.

Figure 4:
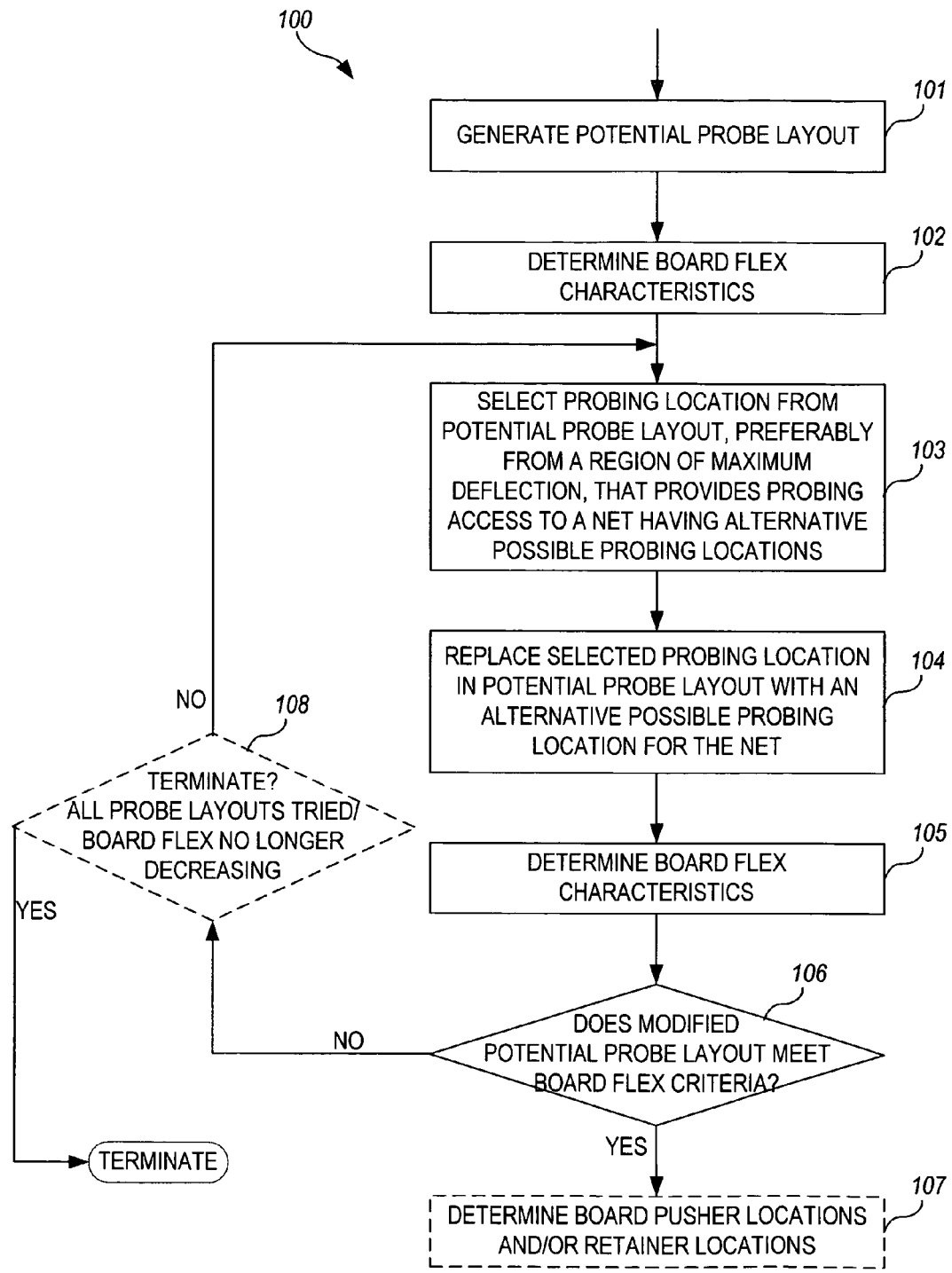
FIG. 4 is a flowchart of a preferred method of operation of the probing location selection system of FIG. 3.

FIG. 4 is an operational flowchart illustrating one preferred method of operation 100 of the invention. In accordance with the method of operation 100, a potential probe layout comprising one or more probing locations per net is generated (step 101), for example by the potential probe layout generation function 12 of FIG. 3. Based on the potential probe layout, board flex characteristics are determined (step 102), for example, by the deflection analyzer 18 of FIG. 3. In the preferred embodiment, the board flex characteristics include one or more points or regions of maximum deflection and/or one or more points or regions of minimum deflection, determined in accordance with the algorithm described hereinafter.

A probing location from the potential probe layout that is preferably located in a region of maximum deflection and is associated with a net having one or more alternative possible probing locations is selected (step 103), for example by the probing location selection function 22 of FIG. 3. The potential probe layout is modified (step 104) by replacing the selected probing location with one of the one or more alternate probing locations associated with the net. Preferably, the alternate probing location chosen to replace the selected probing location is located in a region of minimum or reduced deflection.

The board flex characteristics are then recalculated (step 105), and a determination is made as to whether the board flex characteristics associated with the modified potential probe layout meet the predetermined board flex criteria (step 106). The board flex characteristics preferably include points or regions on the board of maximum and/or minimum deflection and associated deflection magnitudes and directions (if the board allows dual-side probing access). The predetermined board flex criteria may include, for example, a maximum deflection magnitude threshold value, and the determination involves a comparison of the respective magnitudes of the points or regions of maximum deflection to the maximum deflection magnitude threshold value. The predetermined board flex criteria may also or instead include, for example, a maximum deflection difference threshold value, and the determination involves calculating the difference between the respective magnitudes of the respective areas of maximum deflection and the respective magnitudes of the respective areas of minimum deflection and a comparison of the calculated difference to the maximum deflection difference threshold value.

If the comparison shows that the respective magnitudes of the points or regions of maximum deflection do not meet the board flex criteria (for example, by exceeding the maximum deflection magnitude threshold value or exceeding a maximum allowed difference between the respective magnitudes of the respective areas of maximum deflection and the respective magnitudes of the respective areas of minimum deflection or the difference between the respective magnitudes of the respective areas of maximum deflection and the respective magnitudes of the respective areas of minimum deflection is still converging), then steps 103 through 106 are repeated.

Optionally, a termination check may be implemented to avoid infinite loops in cases where no layout solution exists that would meet the board flex criteria. In this regard, a step 108 is implemented that decides whether to terminate the algorithm based on predefined termination criteria. The termination criteria may require termination if all possible probe layouts have been tried or if the max board flex is no longer decreasing, or may include other criteria not specifically mentioned here.

If the comparison shows, however, that the respective magnitudes of the points or regions of maximum deflection meet the board flex criteria (for example, by meeting or amounting to less than the maximum deflection magnitude threshold value or the difference between the respective magnitudes of the respective areas of maximum deflection and the respective magnitudes of the respective areas of minimum deflection have met a maximum deflection difference threshold value or no longer converge), then the potential probe layout as modified by all previous iterations represents an acceptable probe layout for the probing locations of the PCB design.

Once an acceptable probe layout is obtained, board pusher locations and/or retainer locations are preferably calculated (step 107) to achieve minimum board flex. Board pushers operate to push against the printed circuit board at the pusher locations when the printed circuit board is mounted in the fixture, while board retainers operate to provide a retaining force pulling the printed circuit board in a direction opposite respective directions of deflection in the respective areas of maximum deflection. Board pusher locations and board retainer locations are preferably determined according to the technique described in U.S. Pat. No. 6,839,883, to Ahrikencheikh, entitled "Determining Support Locations In A Wireless Fixture Of A Printed Circuit Assembly Tester", which is assigned to the Assignee of record herein and is hereby incorporated by reference for all that it teaches.

Figure 5A:
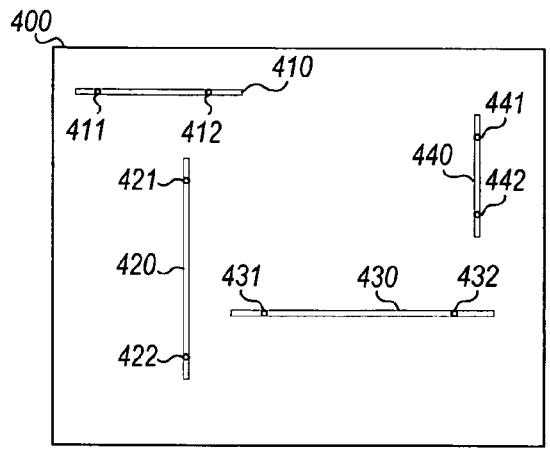
FIG. 5 is a plan view of an example PCB design prior to application of the probing location selection algorithm of the invention.
FIG. 5B is a plan view of the PCB design of FIG. 5A illustrating an initial probe layout.
FIG. 5C is a plan view of the PCB design of FIGS. 5A and 5B illustrating a modified probe layout according to a first iteration of the probing location selection algorithm of the invention.
FIG. 5D is a plan view of the PCB design of FIGS. 5A, 5B, and 5C illustrating a modified probe layout according to a first iteration of the probing location selection algorithm of the invention.

Referring back to FIG. 2, the goal of the invention is to determine a probe layout, prior to the determination of the locations of any board pushers or retainers to be added to the tester fixture, that minimizes the board flex of the PCB under test resulting from the forces $Fu_i$ and $Fd_j$ of the fixture probes when the PCB under test is mounted in the tester fixture. FIGS. 5A-5D, each of which shows a plan view of the probing side of a PCB board, illustrate an example of the operation of the probing location selection algorithm of the invention on a simplified PCB 400. FIG. 5A illustrates four nets 410, 420, 430 and 440. Net 410 includes alternative possible probing locations 411 and 412. Net 420 includes alternative possible probing locations 421 and 422. Net 430 includes alternative possible probing locations 431 and 432. Net 440 includes alternative possible probing locations 441 and 442. In the illustrative example, only four nets are shown, each having only two alternative probing locations. In practice, a given PCB may have thousands of nets and many times more alternative probing locations from which to choose. Since the principles of operation scale to even a small few nets and associated alternative probing locations, only four nets each have two different alternative probing locations is shown for ease of illustration and explanation.

Figure 5B:
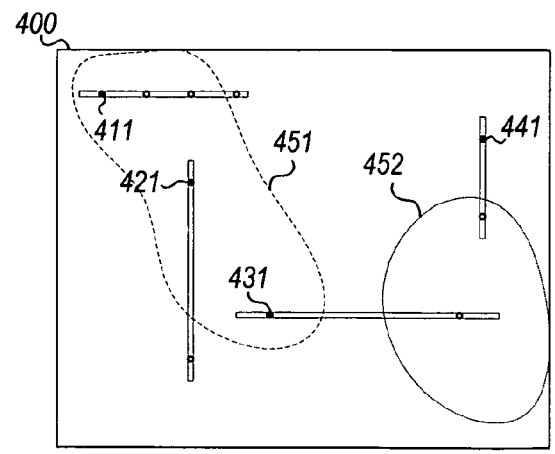

FIG. 5B shows the PCB 400 with an initial potential probe layout. The selected probing locations are shown in solid, while unselected alternative probing locations are shown with no fill. As illustrated, in this example, the initial potential probe layout selects probing location 411 from net 410, probing location 421 from net 420, probing location 431 from net 430, and probing location 441 from net 440. A region of maximum deflection is shown at 451, and a region of minimum deflection is shown at 452. Probing locations 411, 421, and 431 are each in the region of maximum deflection 451, and net 430 may be alternatively probed at alternative probing location 432, which is located in the region of minimum deflection 452.

Figure 5C:
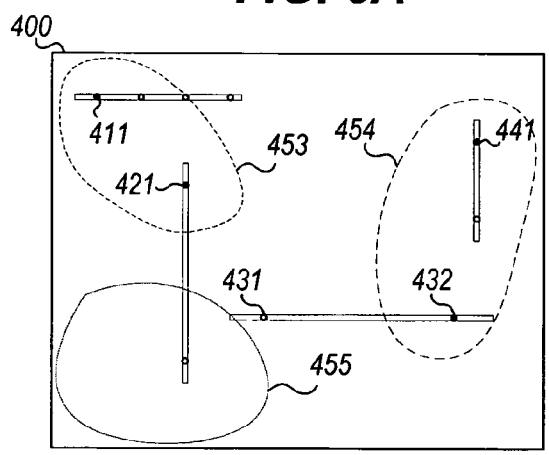

FIG. 5C shows the PCB 400 after the probing location selection algorithm has replaced probing location 431 with alternative probing location 432. The new regions of maximum deflection 453, 454 and minimum deflection 455 are also shown. Probing locations 411, 421, 432, and 441 are each in region of maximum deflection 453, 454, and net 420 may be alternatively probed at alterative probing location 422, which is located in the region of minimum deflection 455.

Figure 5D:
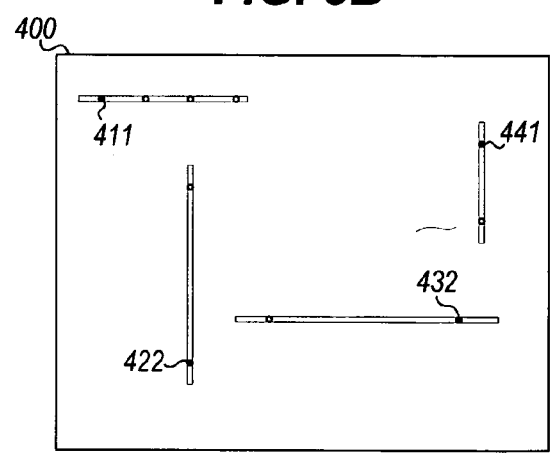

FIG. 5D shows the PCB 400 after the probing location selection algorithm has replaced probing location 421 with alternative probing location 422. For the sake of simplicity, we will assume that at this point, the board flex characteristics meet the board flex criteria and the algorithm stops.

The above detailed description describes a novel method for determining probing locations for a PCB design that offers multiple possible alternative probing locations for a number of nets. The present invention allows the selection of probing locations with a view toward minimizing board flex, which reduces the number of board pushers and/or board retainers required in the fixture.

Of course, it will be appreciated that the placement of probing locations is not limited to placement on a single side of the PCB. In an alternative embodiment, probing locations may be selected on both the top side and bottom side of the PCB so long as the tester fixture supports dual-sided probing and so long nets with alternative probing locations are implemented on both sides of the board. Additionally, when calculating the board flex characteristics, any knowledge about the board and/or fixture may be used. For example, if known, the magnitude of force and locations of any fixed probes or pins that contact the PCB under loaded conditions, screws, clamps, spacers, retainers on either side of the PCB may be used in the calculations, and preferably are used to increase the accuracy of the calculations.

Those of skill in the art will appreciate that the methods described and illustrated herein may be implemented in software, firmware or hardware, or any suitable combination thereof. Preferably, the method and apparatus are implemented in software, for purposes of low cost and flexibility, which run on computer hardware. Thus, those of skill in the art will appreciate that the method and apparatus of the invention may be implemented by a computer or microprocessor process in which instructions are executed, the instructions being stored for execution on a computer-readable medium and being executed by any suitable instruction processor. Alternate embodiments are contemplated, however, and are within the spirit and scope of the invention.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for determining a set of probing locations for a printed circuit board design, said printed circuit board design comprising a plurality of nets, at least some of the plurality of nets having a plurality of alternative possible probing locations, the method comprising the steps of:

generating a potential probe layout comprising one or more probing locations per net;

determining board flex characteristics based on the potential probe layout;

selecting a probing location from the potential probe layout that is located in a region of maximum deflection and is associated with a net having one or more alternative probing locations;

modifying the potential probe layout by replacing the selected probing location with one of the one or more alternate probing locations associated with the net.

2. The method of claim 1, further comprising the step of:

redetermining board flex characteristics based on the potential probe layout, after modifying the potential probe layout, and then repeating the selecting step and modifying step if the board flex characteristics do not meet predefined board flex criteria.

3. The method of claim 2, wherein:

the predefined board flex criteria comprises a requirement that maximum deflection of the printed circuit board design is less than a predefined threshold value.

4. The method of claim 2, wherein:
the predefined board flex criteria comprises a requirement that maximum deflection of the printed circuit board design is no longer changing.

5. The method of claim 2, further comprising the steps of:
based on the potential probe layout, determining one or more regions of minimum deflection; and
selecting the probing location to be one of the one or more alterative probing locations associated with the net that is located in a region of minimum deflection.

6. The method of claim 5, wherein:
the predefined board flex criteria comprises a requirement that a difference between a maximum deflection of the printed circuit board design and a minimum deflection of the printed circuit board is less than a predetermined threshold value.

7. The method of claim 5, wherein:
the predefined board flex criteria comprises a requirement that a difference between a maximum deflection of the printed circuit board design and a minimum deflection of the printed circuit board is no longer changing.

8. The method of claim 1, further comprising the step of:
redetermining board flex characteristics based on the potential probe layout, after modifying the potential probe layout, and then repeating the selecting step and modifying step if the board flex characteristics do not meet predefined board flex criteria and no termination conditions are met.

9. The method of claim 1, further comprising the step of:
redetermining board flex characteristics based on the potential probe layout, after modifying the potential probe layout, and then calculating pusher locations to push against the printed circuit board in areas of maximum deflection if the board flex characteristics do meet the predefined board flex criteria; and
adding respective board pushers in a fixture design at the pusher locations.

10. The method of claim 9, further comprising the step of:
calculating retainer locations to provide a retaining force pulling the printed circuit board in a direction opposite respective directions of deflection in the respective areas of maximum deflection if the board flex characteristics do meet the predefined board flex criteria; and
adding respective board retainers in a fixture design at the retainer locations.

11. A computer readable storage medium tangibly embodying program instructions implementing a method for determining a set of probing locations for a printed circuit board design, said printed circuit board design comprising a plurality of nets, at least some of the plurality of nets having a plurality of alternative possible probing locations, the method comprising the steps of:
generating a potential probe layout comprising one or more probing locations per net;
determining board flex characteristics based on the potential probe layout;
selecting a probing location from the potential probe layout that is located in a region of maximum deflection and is associated with a net having one or more alternative probing locations;
modifying the potential probe layout by replacing the selected probing location with one of the one or more alternate probing locations associated with the net.

12. The computer readable storage medium of claim 11, further comprising the step of:
redetermining board flex characteristics based on the potential probe layout, after modifying the potential probe layout, and then repeating the selecting step and modifying step if the board flex characteristics do not meet predefined board flex criteria.

13. The computer readable storage medium of claim 12, wherein:
the predefined board flex criteria comprises a requirement that maximum deflection of the printed circuit board design is less than a predefined threshold value.

14. The computer readable storage medium of claim 12, wherein:
the predefined board flex criteria comprises a requirement that maximum deflection of the printed circuit board design is no longer changing.

15. The computer readable storage medium of claim 12, further comprising the steps of:
based on the potential probe layout, determining one or more regions of minimum deflection; and
selecting the probing location to be one of the one or more alternative probing locations associated with the net that is located in a region of minimum deflection.

16. The computer readable storage medium of claim 15, wherein:
the predefined board flex criteria comprises a requirement that a difference between a maximum deflection of the printed circuit board design and a minimum deflection of the printed circuit board is less than a predetermined threshold value.

17. The computer readable storage medium of claim 15, wherein:
the predefined board flex criteria comprises a requirement that a difference between a maximum deflection of the printed circuit board design and a minimum deflection of the printed circuit board is no longer changing.

18. The computer readable storage medium of claim 11, further comprising the step of:
redetermining board flex characteristics based on the potential probe layout, after modifying the potential probe layout, and then repeating the selecting step and modifying step if the board flex characteristics do not meet predefined board flex criteria and no termination conditions are met.

19. The computer readable storage medium of claim 11, further comprising the step of:
redetermining board flex characteristics based on the potential probe layout, after modifying the potential probe layout, and then calculating pusher locations to push against the printed circuit board in areas of maximum deflection if the board flex characteristics do meet the predefined board flex criteria; and
adding respective board pushers in a fixture design at the pusher locations.

20. The computer readable storage medium of claim 19, further comprising the step of:
calculating retainer locations to provide a retaining force pulling the printed circuit board in a direction opposite respective directions of deflection in the respective areas of maximum deflection if the board flex characteristics do meet the predefined board flex criteria; and
adding respective board retainers in a fixture design at the retainer locations.

21. An apparatus for determining a set of probing locations for a printed circuit board, comprising:
a computer readable storage medium tangibly embodying program instructions that are executable by a computer, the program instructions defining,
a potential probe layout generation function which receives a printed circuit board design comprising a plurality of nets, at least some of the plurality of nets having a plurality of alternative probing locations, and generates a potential probe layout comprising one probing location per net;

a printed circuit board deflection analyzer that determines one or more regions of maximum deflection based on the potential probe layout;

a probing location selection function that selects a probing location from the potential probe layout that is located in one of the one or more regions of maximum deflection and is associated with a net having one or more alternative probing locations, and modifies the potential probe layout by replacing the selected probing location with one of the one or more alternate probing locations associated with the net.

22. The apparatus of claim 21, wherein the program instructions further define:

a control function which iteratively submits the modified potential probe layout generated by the probing location selection function to the printed circuit board deflection analyzer to determine one or more regions of maximum deflection associated with the modified potential probe layout, determines whether respective magnitudes of the one or more regions of maximum deflection meet predefined board flex criteria, and if the respective magnitudes of the one or more regions of maximum deflection do not meet the predefined board flex criteria, triggers the probing location selection function to generate a new modified potential probe layout based on the modified potential probe layout and the determined one or more regions of maximum deflection associated with the modified potential probe layout.

* * * * *